United States Patent [19]

Brooks

[11] 4,058,751

[45] Nov. 15, 1977

[54] LIGHT FLASHER CIRCUIT INCLUDING GTO

[75] Inventor: Ronald Robert Brooks, Hamilton Square, N.J.

[73] Assignee: RCA Corporation, New York, N.Y.

[21] Appl. No.: 651,918

[22] Filed: Jan. 23, 1976

[51] Int. Cl.[2] ........................ H05B 39/09; G08B 5/38; H03K 3/02

[52] U.S. Cl. ............................ 315/200 A; 307/132 T; 307/252 C; 315/209 R; 340/81 R; 340/331

[58] Field of Search ............... 315/200 A, 209 R, 194, 315/199, 83, 135, 136; 307/252 C, 284, 132 T; 340/76, 81 R, 331; 331/108 R

[56] References Cited

U.S. PATENT DOCUMENTS

| | | | |
|---|---|---|---|
| 3,271,700 | 9/1966 | Gutzwiller | 307/252 C X |
| 3,343,046 | 9/1967 | Ladd, Jr. | 307/252 C X |
| 3,525,033 | 8/1970 | Greenberg et al. | 307/252 C X |

FOREIGN PATENT DOCUMENTS

| | | | |
|---|---|---|---|
| 1,332,867 | 10/1973 | United Kingdom | 315/200 A |

*Primary Examiner*—Eugene R. La Roche
*Attorney, Agent, or Firm*—H. Christoffersen; Allen LeRoy Limberg; John M. O'Meara

[57] ABSTRACT

A lamp is included as a cathode load for a gate-turn-off silicon controlled rectifier (GTO). The conduction path of a transistor is connected between the gate electrode of the GTO and ground. The GTO and lamp are turned off by applying current in the forward direction through the base-emitter junction of the transistor, thereby turning on the transistor and placing the gate electrode of the GTO at ground. The forward current passes through a thermal circuit breaker which periodically opens in response to the heat produced by the current flow, causing the gate electrode of the GTO to become forward biased via the collector load resistance of the transistor and turn on.

13 Claims, 2 Drawing Figures

LIGHT FLASHER CIRCUIT INCLUDING GTO

Figure 1:
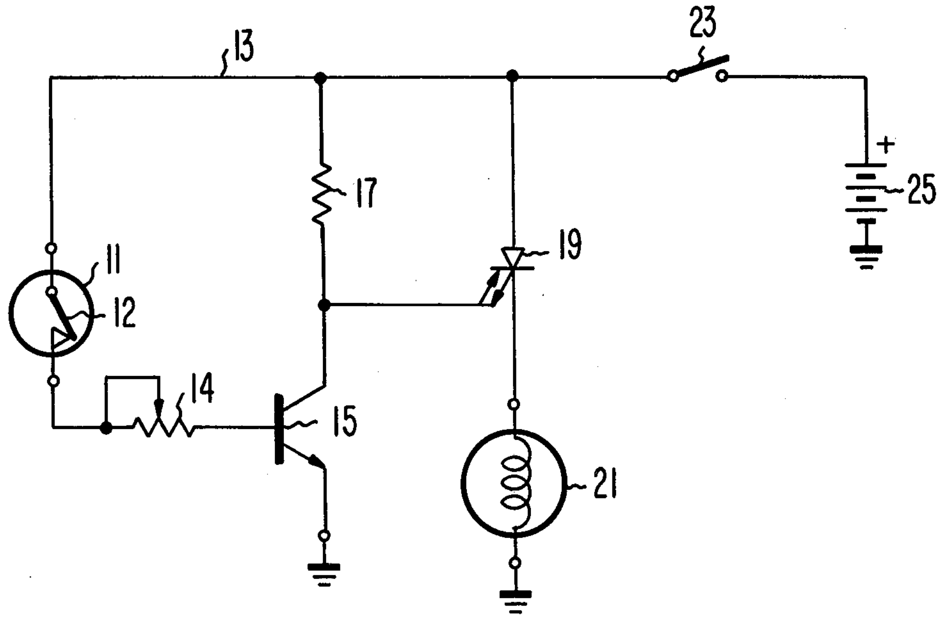

The present invention relates generally to light flasher circuits, and more specifically the kinds useful for signalling emergency hazards.

Highway crews and others use flashing emergency lights to warn motorists of obstructions in roadways. These lights generally are portable and emit highly visible flashes which easily can be observed at a distance. The circuits operating these lights should be reliable, inexpensive, and capable of operating continuously over extended periods of time, and should require little maintenance; however, many of the presently available circuits are deficient in one or more of these respects. For example, some are fairly complex in design, and require a large number of components. Accordingly, they tend to be relatively expensive, and in some cases susceptible to premature failure. Some rely on relay contacts to make and break a conduction path carrying the operating current to the flasher lamp. These contacts tend to become pitted relatively rapidly due to the arc-over involved in switching the current to the lamp (an inductive load), causing reliability problems.

In a light flasher circuit embodying the present invention the lamp is included in the main conduction path of a gate-turn-off silicon controlled rectifier (GTO) and means are provided for switching the gate electrode between the reference and operating voltage levels. In a preferred form of the invention this means includes a transistor whose conduction path is connected between the gate electrode and a point at the reference voltage level, switching means for turning the transistor on and off and a resistance connected between the gate electrode and a terminal to which the operating voltage is applied.

Figure 2:
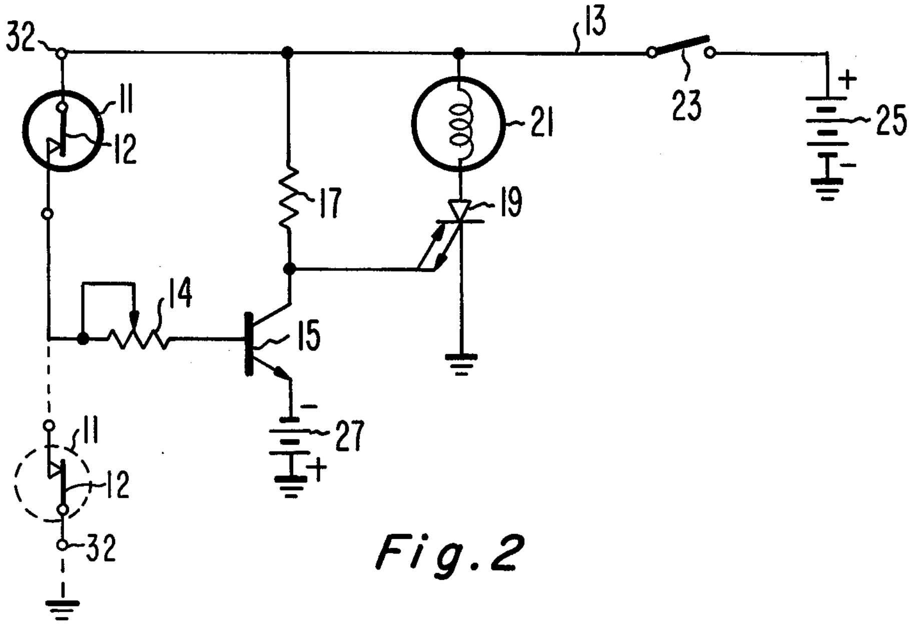

In the drawing:

FIG. 1 is a schematic circuit diagram of a light flasher circuit of a preferred embodiment of the invention; and FIG. 2 is a schematic circuit diagram of a light flasher circuit of an alternative embodiment of the invention.

Referring to FIG. 1, thermal circuit breaker 11 is connected between positive voltage supply bus 13 and one end of a variable resistor 14; the other end of the variable resistor is connected to the base electrode of NPN switching transistor 15. The transistor 15 is connected at its emitter electrode to a point of reference potential, ground in this example, and at its collector electrode to positive bus 13 via resistor 17. Gate-turn-off silicon controlled rectifier (GTO) 19 is connected at its anode electrode to the positive bus 13, at its cathode electrode to one terminal of a flasher lamp 21, the other terminal of which is connected to ground, and at its gate electrode to the collector electrode of transistor 15. The positive bus 13 is connected to the pole of a single-pole-single-throw switch 23. Battery 25 is connected at its positive terminal to the contact of the switch 23, and at its negative terminal to ground. The battery 25 can be replaced by a DC power supply circuit, if portable operation is not required.

In operation, when the switch 23 is closed, current flows from the battery 25 through the normally-closed contacts of the thermal circuit breaker 11, variable resistor 14, and the base-emitter junction of transistor 15, to ground. The voltage of the battery 25 is much greater than the base-emitter threshold voltage ($1V_{BE}$) of switching transistor 15, causing transistor 15 to turn on.

In its on condition, transistor 15 is in saturation and connects the gate electrode to ground via the very low resistance conduction path between its collector and emitter electrodes. As a result, the GTO 19 is turned off.

The flow of current through the conduction path of the thermal circuit breaker 11 continues until the elements of the circuit breaker 11 heat-up sufficiently to open. (The heat-up period required for breaker 11 to open is inversely proportional to the amplitude of the current flowing through breaker 11, or dependent upon the time integral of the amplitude of the current). This interrupts the flow of current to the base electrode of transistor 15 causing the transistor 15 to turn off. The gate electrode of GTO 19 now rises to the positive voltage level on bus 13, as it is connected to that bus by resistor 17, and this causes the gate-cathode junction of the GTO 19 to become forward-biased, and the GTO turn on. Operating current now flows through the anode-to-cathode conduction path of the GTO and through lamp 21, causing the lamp to go on.

After a relatively short period of time, the thermal circuit breaker 11 cools sufficiently so that the contacts 12 of the breakeı 11 again become closed. This starts a new cycle of operation. The transistor goes on, placing the gate of the GTO at ground while its cathode is relatively positive (due to the voltage drop across lamp 21) reverse-biasing the GTO and causing it and the lamp to turn off. Variable resistor 14 provides for adjustment of flash rate of lamp 21, i.e., repetition rate of the flasher circuit.

With present state-of-art GTO's, for optimum operation of the lamp flasher circuit, the flasher lamp 21 should serve as a cathode load for the GTO 19, as shown. If instead it were placed in the anode circuit of the GTO 19, and the cathode electrode of the GTO 19 were connected directly to ground, once turned on, the GTO 19 could remain in the on condition. The reason is that the gate-cathode electrode junction of the GTO 19 may not become sufficiently backbiased to turn off the GTO simply by connecting its gate electrode to ground. This condition is more likely to occur at relatively high operating temperatures, in combination with high load currents. As previously explained, with the lamp 21 serving as a cathode load for the GTO 19, when the GTO 19 is on, the voltage drop across the lamp 21 causes the voltage at the cathode electrode to be positive well-above ground. As a result, when the gate electrode is switched from the positive bus potential back to ground, the voltage drop across the lamp 21 at the instant of such switching insures that the gate-cathode junction is backbiased and that turn off current flows from the gate electrode to ground, to turn off the GTO 19. It follows that if the lamp 21 were placed in the anode circuit of GTO 19, turn-off problem could be substantially reduced by placing a resistor of appropriate value between the cathode electrode of GTO 19 and ground.

In FIG. 2, the flasher circuit shown is substantially identical to that of FIG. 1, except for the addition of a negative supply 27 (battery) in the emitter circuit of transistor 15, the connection of lamp 21 between bus 13 and the anode of GTO 19 (lamp 21 is now an anode load instead of a cathode load), and the connection of the cathode of GTO 19 to ground. The emitter electrode of transistor 15 is now connected to the negative terminal of the battery 27, which also has its positive terminal connected to ground. If desired, terminal 32 of the breaker 11 may be connected to ground rather than the positive bus 13 (through a switch ganged to switch 23) and the current from battery 27 alone depended upon to heat the breaker 11 (see dashed lines representing this alternate connection in phantom).

Operation of the flasher circuit of FIG. 2 is substantially similar to that of the circuit of FIG. 1. The addition of the battery 27 has the advantage over the circuit of FIG. 1, of ensuring the gate will always have a sufficient negative bias to turn-off the GTO 19, regardless of whether the lamp 21 is used as an anode or cathode load for GTO 19. Also, with the lamp 21 placed in the anode circuit of GTO 19, with the cathode of GTO 19 connected to ground, the flasher circuit of FIG. 2 will operate more independently of load current and ambient temperature, than the flasher circuit of FIG. 1 operated with the lamp 21 in the anode circuit. The disadvantage of the circuit of FIG. 2 is that the additional battery 27 is required.

In prior art flasher circuits using the contacts of a relay to switch the full load current to a lamp, the contacts may tend to pit due to the switching of an inductive load (the lamp). As a result, the reliability of such circuits is reduced. Some advantage of the circuits of FIGS. 1 and 2, are first that the contacts 12 of the thermal circuit breaker 11 are switching a purely resistive load, second that these contacts are required to carry only a relatively small current, that through a base-emitter junction, and not the full load current of lamp 21. Therefore, these contacts are expected to be relatively trouble-free and to have very long life.

What is claimed is:

1. A light flasher circuit comprising:

first and second terminals across which a direct current operating potential may be applied;

a gate-turn-off silicon controlled rectifier having a main conduction path between anode and cathode electrodes, and a gate electrode;

a lamp connected in series connection with said conduction path of said rectifier between said first and said second terminals;

resistance means;

a switching transistor having a collector electrode connected both to the gate electrode of said rectifier and via said resistance means to said second terminal, having an emitter electrode coupled to said first terminal, and having a base electrode; and a thermal circuit breaker having a pair of normally-closed mechanical contacts, connected respectively to the base electrode of said transistor and to said second terminal, which said contacts open when the current flowing through them sufficiently heats the breaker and which said contacts close upon sufficient subsequent cooling of said breaker, whereby said thermal circuit breaker selectively applies base current to said first transistor according to a repeating cycle to turn said transistor on and off periodically, in turn to turn said rectifier off and on periodically and to cause said lamp to flash.

2. The light flasher circuit of claim 2, further including variable resistance means connected in a series circuit with said thermal circuit breaker between 'said second terminal and said base electrode, for controlling the frequency of oscillation of said relaxation oscillator.

3. The light flasher circuit of claim 1, where the connection of the emitter electrode of said transistor to said first terminal is through a direct voltage source poled to reverse-bias said gate electrode of said rectifier when said transistor is turned on.

4. A light flasher circuit comprising:

first and second terminals across which a direct current operating potential may be applied;

a gate-turn-off silicon controlled rectifier having a main conduction path between anode and cathode electrodes, and a gate electrode;

a lamp in series connection with said conduction path of said rectifier, between said first and said second terminals;

resistance means;

a switching transistor having a collector electrode connected to the gate electrode of said rectifier and connected through said resistance means to said second terminal, having an emitter electrode connected to said first terminal, and having a base electrode; and means providing recurring selective connection between said second terminal and the base electrode of said transistor including means responsive to the time integral of current flow through said selective connection having each recurring period reaching a predetermined value for interrupting said selective connection for a predetermined interval, thereby turning said transistor on and off, in turn turning said rectifier off and on, causing said lamp to flash.

5. The light flasher circuit of claim 4, which further includes:

a direct voltage source connected between the emitter electrode of said transistor and said first terminal, in a sense to reverse bias said silicon controlled rectifier when said transistor is on.

6. The light flasher circuit as set forth in claim 4, wherein said means in series with the base-emitter path comprises a thermal circuit breaker which opens when the current flowing through it heats the breaker to a given temperature, whereby current flow to said base-emitter path is interrupted.

7. A light flasher circuit comprising, in combination:

a lamp;

a gate-turn-off silicon controlled rectifier having a main conduction path between its anode and cathode electrodes connected in series with said lamp, and a gate electrode, said rectifier being coupled at its anode electrode to a terminal to which an operating voltage may be applied, and coupled at its cathode electrode to a terminal at a reference voltage level;

a transistor having a conduction path between its emitter and collector electrodes and a base electrode, said conduction path being connected between said gate electrode and said terminal at said reference voltage level;

resistance means connected between said gate electrode and said terminal for said operating voltage; and switching means coupled between said terminal for said operating voltage and said base electrode for conducting forward current to the base-emitter path of said transistor for turning the same on, responsive to a parameter of said current flow for turning off when said parameter reaches a given value, and responsive to the cessation of said current flow for turning on again.

8. A light flasher circuit as set forth in claim 7, wherein said switching means comprises a thermal circuit breaker.

9. The light flasher circuit of claim 7, further including a direct voltage source connected between the emitter electrode of said transistor and said terminal at a reference voltage level, in a sense to reverse-bias said silicon controlled rectifier when said transistor is on.

10. A light flasher circuit as set forth in claim 7, wherein said switching means comprising means responsive to the time integral of the amplitude of said current flow.

11. A circuit for cyclically energizing a load comprising:

a gate-turn-off silicon controlled rectifier having a main conduction path between anode and cathode electrodes and having a gate electrode, said load being connected in a series circuit with said main conduction path of said rectifier, and said series circuit connected between first and second terminals between which operating potential is applied;

resistive means;

a switching transistor having a collector electrode connected to said gate electrode of said rectifier and and connected through said resistive means to said first terminal, and having an emitter electrode and a base electrode;

recurrently actuated breaker means having first and second contacts being in connection with each other until the time integral of the amplitude of the current flow between them since their last being connected exceeds a predetermined value to break their connection to each other for a period of time; and means for selectively applying forward bias to the base-emitter junction of said switching transistor to turn said switching transistor on to turn off said rectifier, absent which application of forward bias to its base-emitter junction said switching transistor turns off to permit said rectifier to turn on, said means for selectively applying forward bias including connections of the first and second contacts of said self-actuated breaker means respectively to said first terminal and to the base electrode of said switching transistor, at least one of said connections being through a resistive element, so the base current of said switching transistor determines the times for which the first and second contacts of said breaker means remain in connection and including means for referring the potential at the emitter electrode of said switching transistor to the potential at said second terminal.

12. The circuit of claim 11, wherein said self-actuated breaker comprises a thermal circuit breaker.

13. The circuit of claim 11 wherein said means for referring the potential at the emitter electrode of said switching transistor to the potential at said second terminal comprises a direct voltage source connected between the emitter electrode of said transistor and said second terminal in a poling to reverse-bias said silicon controlled rectifier when said transistor is on.

* * * * *